(12) United States Patent
Shi

(10) Patent No.: US 6,875,268 B2
(45) Date of Patent: Apr. 5, 2005

(54) METHOD OF IMPROVING A SURFACE OF A SUBSTRATE FOR BONDING

(75) Inventor: Binqiang Shi, Agoura Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 241 days.

(21) Appl. No.: 10/251,706

(22) Filed: Sep. 19, 2002

(65) Prior Publication Data

US 2003/0056717 A1 Mar. 27, 2003

Related U.S. Application Data

(60) Provisional application No. 60/325,276, filed on Sep. 26, 2001.

(51) Int. Cl.[7] .............................................. C30B 25/12
(52) U.S. Cl. ...................... 117/1; 117/2; 117/3; 117/94; 117/97
(58) Field of Search ............................. 117/1, 2, 3, 94, 117/97

(56) References Cited

U.S. PATENT DOCUMENTS

| 4,504,007 | A | * | 3/1985 | Anderson et al. | 228/123.1 |
| 4,632,295 | A | * | 12/1986 | Brusic et al. | 228/123.1 |
| 5,478,005 | A | * | 12/1995 | Nguyen | 228/123.1 |
| 5,988,487 | A | * | 11/1999 | MacKay et al. | 228/254 |
| 6,375,060 | B1 | * | 4/2002 | Silhavy | 228/180.22 |

FOREIGN PATENT DOCUMENTS

| EP | 0 727 829 A2 | 8/1996 |
| JP | 61-182217 | 8/1986 |

OTHER PUBLICATIONS

Abstract of JP 61-182217, *Patent Abstracts of Japan*, vol. 011, No. 007 (Jan. 9, 1987).
Bengtsson, S., "Semiconductor Wafer Bonding: A Review of Interfacial Properties and Applications," *Journal of Electronic Materials*, vol. 21, No. 8, pp 841–862 (1992).
Liau, Z.L., et al., "Wafer fusion: A novel technique for optoelectronic device fabrication and monolithic integration," *Applied Physics Letters*, vol. 56, No. 8, pp 737–739 (Feb. 19, 1990).
Takagi, H., et al., "Low–temperature direct bonding of silicon and silicon dioxide by the surface activation method," *Sensors and Actuators A*, vol. 70, pp 164–170 (1998).

* cited by examiner

Primary Examiner—Robert Kunemund
(74) Attorney, Agent, or Firm—Ladas & Parry LLC

(57) ABSTRACT

A method of preparing a surface of a substrate for bonding by removing oxide and altering the atomic surface of the substrate is described. The method comprises, providing a substrate comprised of a plurality of elements. The substrate is held at an elevated temperature and an over-pressure of gas is allowed to flow over the surface of the substrate. The gas over-pressure is comprised of an element found in the plurality of elements. Holding the substrate at an elevated temperature helps removes essentially all the oxide on the surface of the substrate. However, the elevated temperatures also evaporate certain atoms on the substrate surface and cause other atoms on the substrate surface to migrate. Flowing a gas over the surface of the substrate, helps to replace the atoms which have evaporated thereby preventing movement of other atoms. After removing the oxide, the substrate is allowed to cool. By adjusting the temperature of the substrate when the gas over-pressure is turned off, the surface of the substrate may or may not contains atoms which comprise the gas over-pressure. This allows the surface of the substrate to be essentially oxide free and contain the desired atoms for bonding.

39 Claims, 4 Drawing Sheets

METHOD OF IMPROVING A SURFACE OF A SUBSTRATE FOR BONDING

CLAIM OF BENEFITS OF PROVISIONAL APPLICATION

Applicants claim the benefits of their co-pending U.S. Provisional application Ser. No. 60/325,276, filed on 26 Sep. 2001, the contents of which are hereby expressly incorporated herein in their entirety by this reference.

FIELD OF THE INVENTION

The present invention relates to a method for improving the surface of a substrate for bonding. More specifically, the present method relates to a method for improving the surface of a substrate for bonding by removing essentially all the oxide from the surface of the substrate and maintaining the crystal structure of the substrate. The present invention also provides a method for providing a substrate surface that contains the desired atoms for bonding.

BACKGROUND OF THE INVENTION

Direct substrate bonding is an attractive technique for integrating materials of dissimilar lattice constants and/or crystal structures. Direct substrate bonding can be performed using a number of different prior art methods, but each prior art method has drawbacks. Two of these methods are performed by bringing substrate surfaces into contact with surfaces that have either been chemically treated, or plasma etched. Following each of these procedures, the substrate surface is annealed at a high temperature. As disclosed in Bengtsson, *Journal of Electronic Materials*, Vol. 21, No. 8 "Semiconductor Wafer Bonding: A Review of Interfacial Properties and Applications," Mar. 6, 1992 pp. 849, one of the main disadvantages to using treatment chemicals is that because the substrate is treated while exposed to the atmosphere, the substrate is prone to having an oxide, a carbon, or another particle contaminant present on the substrate. In addition, as disclosed by Takagi, Maeda, Chung, Suga, in *Sensors and Actuators*, "Low-temperature direct bonding of silicon and silicon dioxide by the surface activation method," Feb. 3, 1998, pp. 168–169, the main disadvantage to using plasma etching, is that plasma etching results in surfaces with a rough morphology. Furthermore, both chemical processes and plasma etching are intended to remove material. They do not provide a substrate surface specifically intended for bonding.

As a result, there is a need for a method of preparing a substrate surface for bonding, which eliminates oxide on the surface of the substrate, maintains a high quality crystal structure, and provides a surface with atoms specifically for bonding.

SUMMARY OF THE INVENTION

The purpose of the present invention is to solve the above mentioned problems and provide a reliable method for providing a substrate surface suitable for bonding. In accordance with one aspect of this invention, a substrate surface undergoes treatment to help create an essentially oxide free surface. In order to remove oxide from the surface of the substrate, the substrate is placed in a MBE system, wherein a near vacuum is created. Once the pressure is taken down, the substrate is held at an elevated temperature for a certain amount of time. Holding the substrate at the elevated temperature helps evaporate the oxide on the surface of the substrate, thereby resulting in a surface that is essentially oxide free.

While held at the elevated temperature, an over pressure of a gas is allowed to flow over the substrate surface in the depressurized MBE system. The gas that is flowing over the surface is comprised of one element that is also found in the plurality of elements comprising the substrate. This is the common element. When the substrate is held at the elevated temperature to remove oxide, it is possible for the atoms of the common element on the substrate surface to evaporate as a result of the elevated temperature. This is problematic, since the atoms of the remaining elements in the substrate can migrate, thereby deteriorating the crystal structure of the substrate. By flowing the over-pressure of gas, atoms of the common element from the gas will be chemisorbed on the substrate surface and essentially replace the atoms of the common element which have evaporated from the surface of the substrate. So long as the temperature of the substrate remains high enough, the atoms of the common element that are chemisorbed on the surface may continue to evaporate. However, the continuous chemisorbtion/evaporation cycle of atoms of the common element on the substrate surface will help prevent the atoms of the remaining elements comprising the substrate from migrating. The over-pressure of gas continues to flow until the substrate is allowed to cool at which point the over-pressure of gas is stopped. This treatment provides an essentially oxide free surface and helps maintain the crystal structure of the substrate.

It is another object of the present invention to provide a substrate surface comprised of pre-selected atoms. The pre-selected atoms are chosen based on their ability to bond with the atoms on the surface of another substrate. By using this technique to prepare a substrate for bonding, it is possible to make use of the strong bonding tendencies of certain groups of semiconductor metals.

Once the substrate is allowed to cool, the temperature of the substrate is closely monitored. The over-pressure of gas can be turned off any time after the substrate is allowed to cool, however the temperature of the substrate when the over-pressure of gas is turned off determines whether atoms from the common element remain on the substrate surface. As aforementioned, once the substrate is allowed to cool, the atoms of the common element on the surface of the substrate may continue to evaporate. If the over-pressure of gas is turned off when the temperature of the substrate is above the evaporation temperature of atoms of the common element from the substrate surface, then the surface of the substrate will not contain those atoms. However, if the over-pressure of gas is turned off when the temperature of the substrate is below the evaporation temperature of atoms of the common element, then the substrate surface will contain those atoms.

For example, if the substrate surface comprises InP and the gas comprises $P_2$, P atoms will evaporate when the substrate is held at a temperature above the evaporation temperature of P atoms from the InP substrate. However, the evaporated P atoms will be replaced by the P atoms from the $P_2$ over-pressure, thereby helping to prevent the In atoms from migrating. Furthermore, if the $P_2$ over-pressure is shut off when the temperature of the substrate is above the evaporation temperature of P atoms from the substrate, then the surface of the substrate will not contain P atoms. However, if the temperature of the substrate is below the evaporation temperature of P atoms from the substrate, when the $P_2$ over pressure is shut off, then the surface of the substrate will contain P atoms.

It is another object of this invention to use MBE techniques to grow an epitaxial layer on the substrate surface. If the substrate does not contain the desired elements for bonding, an epitaxial layer having the desired elements can be grown. By using an epitaxial layer, the epitaxial layer is sure to be of a high material quality, free of damage, and contain few impurities. It is well-known that the use of MBE techniques allows for strict control over the composition and thickness of an epitaxial layer grown on the surface of the substrate. Ultra thin surface layers can be grown on top of active device layers for achieving strong bonds. Once the epitaxial layer is grown, the substrate and the epitaxial layer can undergo the aforementioned technique to provide an oxide free surface on the epitaxial layer containing only the desired atoms.

Lastly, another aspect of the invention is that because the epitaxial layers are prepared and bonded entirely in a depressurized MBE system we can be sure that the epitaxial layers will not be exposed to any oxide. Substrate surfaces prepared outside of a depressurized system are prone to collecting a very thin oxide layer on the surface, which weakens the formed bonds. By bonding the substrate surfaces in the MBE system, the formed bonds will not be weakened by unnecessary oxide.

DETAILED DESCRIPTIONS OF PREFERRED EMBODIMENTS

The present invention will now be described more fully hereinafter with reference to the accompanying drawings, in which preferred embodiments of the invention are shown. This invention may be embodied in many different forms and should not be construed as limited to the embodiments set forth herein.

Overview

A method of improving the surface of a substrate for bonding will now be described. In this procedure, a substrate comprising group III–V elements is depressurized in a MBE system and held at an elevated temperature, while an over-pressure of gas comprising a group V element is allowed to flow over the substrate surface. The group V element comprising the gas is the same element comprising the group V element in the substrate. Holding the substrate at an elevated temperature helps remove the oxide on the substrate surface, and evaporates atoms of the group V element on the substrate surface. The over-pressure of gas flowing over the surface of the substrate helps replace atoms of the group V element which have evaporated from the surface, thereby preventing atoms of the group III element in the substrate from moving. This helps ensure that the crystal structure of the substrate remains intact and the surface is essentially oxide free. After a certain period of time, the substrate is allowed to cool and the gas over-pressure is turned off. The temperature of the substrate when the gas is shut off determines whether atoms of the group V element remain on the surface of the substrate or evaporate. In this way it is possible to select whether the substrate surface contains atoms of the group V element. Next, a second substrate is brought into a MBE system, where it is depressurized. The second substrate may undergo the heat treatment and exposure to the flowing gas in the depressurized MBE system, however it is not required. Then, while still depressurized the surface of the second substrate can be brought into contact with the surface of the first substrate where the atoms on the surface of the first substrate will form covalent bonds with atoms on the surface of the second substrate.

First Embodiment

Figure 1:
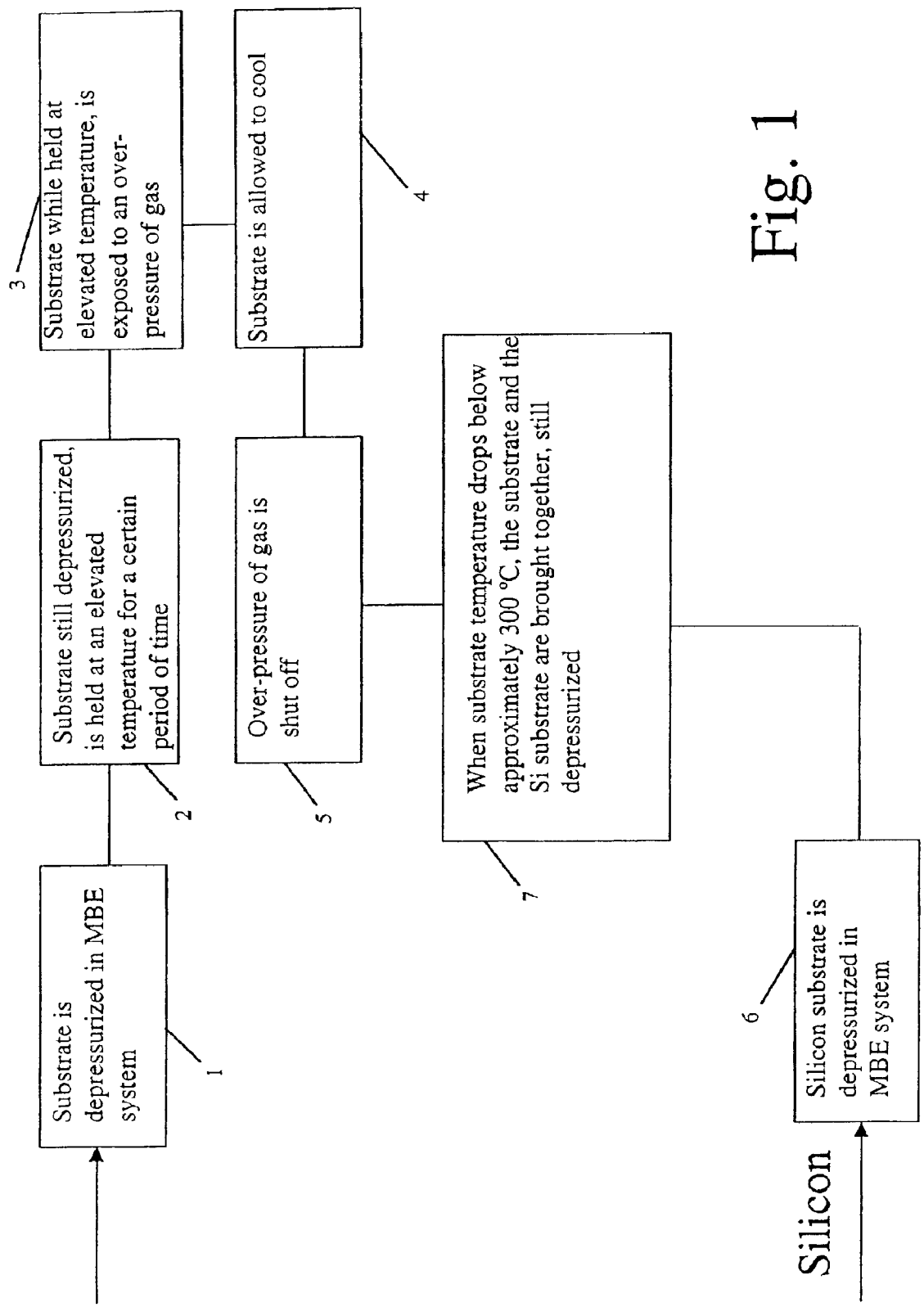
FIG. 1 is a block diagram showing the method for preparing a substrate surface for bonding.
Figure 2:
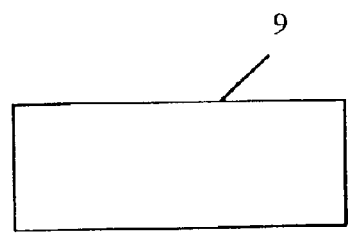
FIG. 2 shows a cross sectional view of a InP substrate.

Shown in blocks 1–7 of FIG. 1 is a generalized block diagram of the method according to the present invention. A first embodiment of the present invention is described with reference to an InP substrate 9 shown in FIG. 2. The InP substrate 9 is preferably epitaxially grown, however if the InP substrate is not epitaxially grown, an InP layer may be epitaxially grown on the InP substrate to provide an epitaxially grown layer for bonding purposes.

Figure 5:
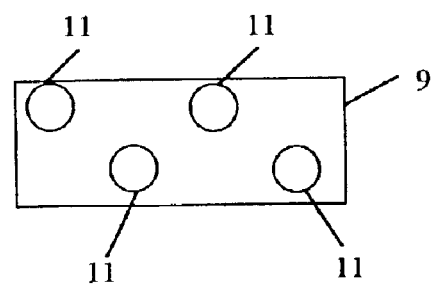
FIG. 5 shows a top view of the surface of the InP substrate without P atoms.
Figure 3:
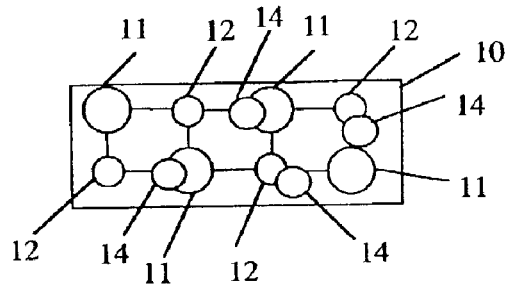
FIG. 3 shows a top view of the surface of the InP substrate with In atoms, P atoms, and oxide.
Figure 4:
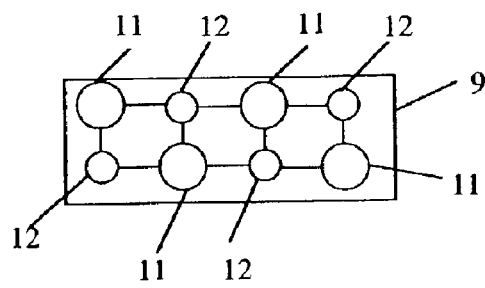
FIG. 4 shows a top view of the surface of the InP substrate oxide free.

Shown in FIG. 3 is the surface 10 of the InP substrate 9. The surface 10 contains In atoms 11 and P atoms 12. The surface also contains oxide 14, which is undesirable for bonding. The InP substrate 9 is depressurized in a MBE system where the pressure is preferably no greater than $3 \times 10^{-6}$ pa (see block 1, FIG. 1). The InP substrate 9 is heated in the depressurized MBE system until the temperature is in the range of 500° C.–535° C., preferably about 515° C. (see block 2 of FIG. 2). Once the temperature is about 515° C. or within several degrees, the InP substrate is held at that temperature for 10 minutes–20 minutes, preferably about 15 minutes, in the presence of a $P_2$ gas over-pressure, where the gas is at a pressure no greater than $1 \times 10^{-2}$ pa. (see block 3 of FIG. 1). Holding the InP substrate 9 at a temperature in the range of 500° C.–535° C. will evaporate and remove essentially all the oxide on the surface 10 of the InP substrate 9, as shown in FIG. 4. Typically, this results in the total area of the surface 10 of the substrate 9 being covered with less than 0.001% oxide. However, holding the InP substrate 9 at an elevated temperature in the range of 500° C.–535° C. can also evaporate and remove P atoms 12 on the surface 10 of the InP substrate 9 as well as P atoms located about 3 Å beneath the surface 10 of the InP substrate 9. The removal of P atoms 12 from the InP substrate 9 can cause the In atoms 11 to migrate and alter their position in the crystal structure, which is an undesirable effect. By flowing an over-pressure of $P_2$ over the surface 10 of the InP substrate 9 while it is in the desired elevated temperature range, P atoms from the $P_2$ over-pressure will be chemisorbed on the surface 10 of the InP substrate 9. The P atoms from the $P_2$ over-pressure will bond with the In atoms 11 and replace the P atoms that have evaporated, thereby keeping the In atoms 11 from migrating, and keeping the crystal structure intact. After approximately 15 minutes of exposure to $P_2$, the substrate is allowed to cool (see block 4 of FIG. 1). When the temperature of the substrate 9 drops below about 400° C., the $P_2$ gas supply is shut off (see block 5 of FIG. 1) to suppress further evaporation of P atoms from beneath the surface 10 of the InP substrate 9. In addition, because the temperature is reduced, the In atoms 11 are less likely to move, thereby keeping the crystal structure intact. However, until the temperature of the InP substrate 9 falls below 180° C., the P atoms 12 on the surface of the InP substrate 9 continue to evaporate from the surface 10. In this way, the surface 10 of the InP substrate 9 surface is essentially oxide free and contains only In atoms 11, as shown in FIG. 5. At this point, the InP substrate 9 remains in the MBE system at a pressure no greater than $3 \times 10^{-6}$ pa.

Next, a silicon substrate is depressurized in a MBE system (see block 6 of FIG. 1) at a pressure no greater than $3 \times 10^{-6}$ pa, while remaining at room temperature (see block 7 of FIG. 1). When the InP substrate 9 has cooled to a temperature no greater than 300° C., the depressurized silicon substrate is brought into contact with the depressurized InP substrate 9 prepared according to the method of blocks 1–5 through the use of a transfer rod (see block 7 of FIG. 1). The silicon substrate does not need to undergo the treatment described in blocks 3–5 of FIG. 1 because the silicon substrate is comprised of only one element and oxide generally will not form on the surface of silicon substrates when exposed to air. The rod is held in place to allow the InP substrate 9 and silicon substrate to bond. When the temperature of the InP substrate 9 drops below 170° C., for example, the rod may be removed, so that the In atoms 11 on the surface 10 of the InP substrate 9 may form covalent bonds with the Si atoms.

Bond strength was tested on test samples, prepared according to the method of blocks 1–7 of FIG. 1. For example, the silicon and InP substrates bonded to one another were placed on a hot plate heated to 160° C. Attempts to separate the two substrates with tweezers failed even when the force applied was so large that the InP substrate 9 and Si substrate were damaged. The same bonding procedures also had successful results in bonding a silicon substrate covered with a 40 $\mu$m $SiO_2$ film to the InP substrate.

Second Embodiment

In a second embodiment, different substrates and gases can be used. Furthermore, the temperature at which the gas over-pressure is shut off can be adjusted to determine whether atoms from the gas over-pressure remain on the surface of the substrate. For example, an arsenic ($As_2$) over-pressure can be used with a substrate containing arsenic (such as InAs, GaAs, AlAs, InGaAs, InAlAs, InGaAlAs) in lieu of the $P_2$ gas described in the first embodiment. The same practice can be applied to a substrate containing antimony (such as AlSb, AlGaSb) by utilizing an $Sb_2$ overpressure in lieu of the $P_2$ gas described in the first embodiment.

Figure 6:
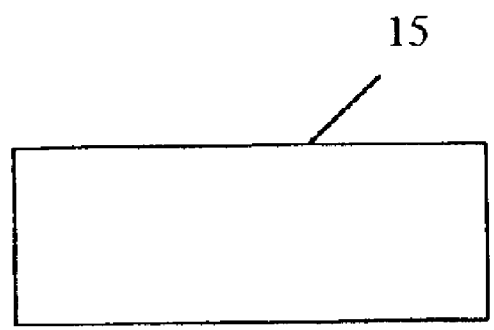
FIG. 6 shows a cross sectional view of an InAs substrate.
Figure 7:
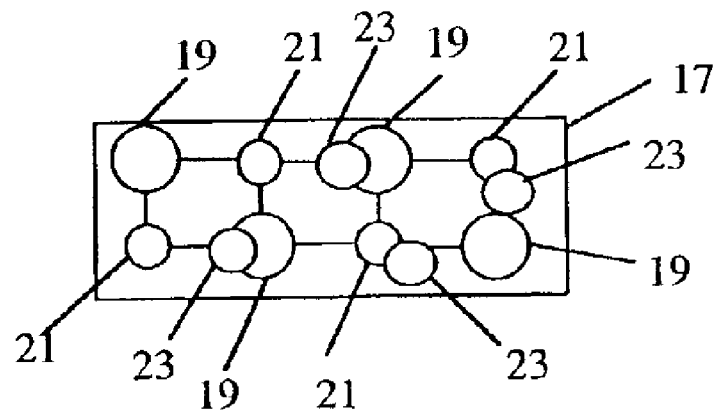
FIG. 7 shows a top view of the surface of the InAs substrate with In atoms, As atoms, and oxide.
Figure 8:
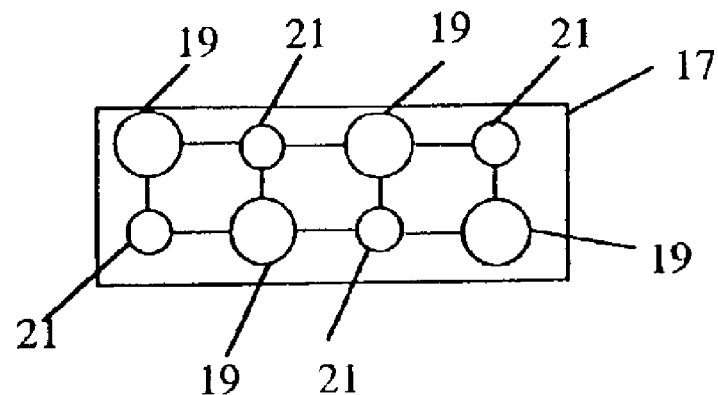
FIG. 8 shows a top view of the oxide removed from the surface of the InAs substrate.

An example of using an $As_2$ over-pressure is described with reference to blocks 1–5 of FIG. 1, the InP substrate 9 discussed in the first embodiment, and FIGS. 6–9, to create a bond between the InP substrate 9 described in the first embodiment and an InAs substrate 15 shown in FIG. 6. Using the aforementioned technique described with reference to blocks 1–5 of FIG. 1, the InP substrate 9 described in the first embodiment, having an essentially oxide free surface and containing only In atoms 11, as shown in FIG. 5 is provided. The InAs substrate 15 is preferably epitaxially grown and has a surface 17, which contains In atoms 19, As atoms 21, and oxide 23, as shown in FIG. 7. The InAs substrate 15 undergoes the treatment described in blocks 1–5 of FIG. 1 using the same parameters applied to the InP substrate 9 described in the first embodiment, except an over-pressure of $As_2$ is used instead of $P_2$ (see block 3 of FIG. 1). The As atoms from the $As_2$ over-pressure are chemisorbed on the surface 17 of the InAs substrate 15 and help replace the As atoms 21 which have evaporated. Also, the $As_2$ over-pressure is turned off when the temperature of the InAs substrate 15 falls below 280° C. (see block 4 of FIG. 1) instead of 400° C. as discussed in the first embodiment with reference to the InP substrate 9. As atoms 21 will continue to evaporate from the surface 17 of the InAs substrate 15 at temperatures greater than about 280° C. As a result, turning off the $As_2$ over-pressure when the InAs substrate 15 is below 280° C. will help prevent As atoms from the $As_2$ over-pressure which are chemisorbed on the surface 17 from evaporating. This yields a surface 17 that is essentially oxide free and contains In atoms 19 and As atoms 21. When the temperature of the InP substrate 9 and InAs substrate 15 are at a temperature below 300° C. in the depressurized system, they can be brought together where the In atoms 11 on the InP substrate 9 will form covalent bonds with the As atoms 21 on the InAs substrate 15.

Figure 9:
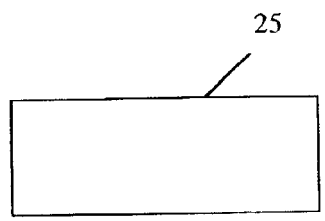
FIG. 9 shows a cross sectional view of an InP substrate
Figure 10:
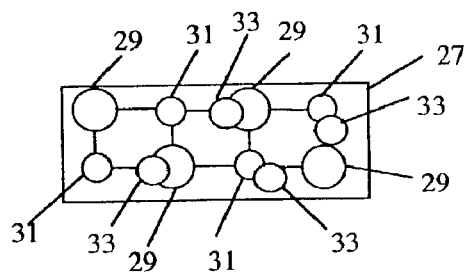
FIG. 10 shows a top view of the surface of the InP substrate with In atoms, P atoms, and oxide.
Figure 11:
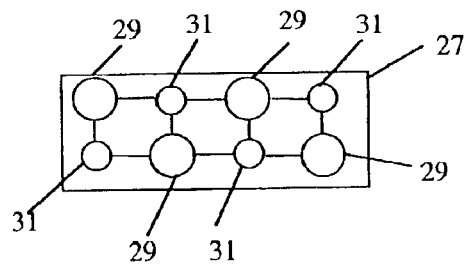
FIG. 11 shows a top view of the surface of the InP substrate oxide free.

To create a stronger bond, it is possible to utilize the fact that a Ga—P bond (230 kJ/mole) is stronger than the In—As bond (201 kJ/mole) previously discussed. In order to utilize the strength of the Ga—P bond, an InP substrate 25, preferably epitaxially grown, is provided as shown in FIG. 9. The surface 27 of the InP substrate 25 contains In atoms 29, P atoms 31, and oxide 33, as shown in FIG. 10. The InP substrate 25 undergoes the treatment described in blocks 1–5 of FIG. 1 with the same parameters used for the InP substrate 9 discussed in the first embodiment, except the $P_2$ over-pressure is turned off when the temperature of the InP substrate 25 is below 180° C. instead of 400° C., as discussed in the first embodiment. Once the temperature of the InP substrate 25 falls below 180° C., the P atoms from the $P_2$ over-pressure which are chemisorbed on the InP substrate 25 will not evaporate. This allows the surface 27 of the InP substrate 25 to contain both In atoms 29 and P atoms 31, and is essentially free of oxide, as shown in FIG. 11.

Figure 12:
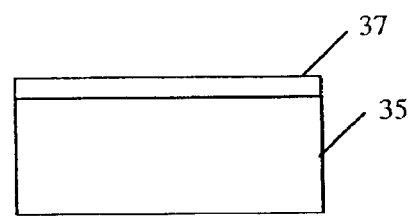
FIG. 12 shows a cross sectional view of an InAs substrate with an epitaxial GaP layer.
Figure 13:
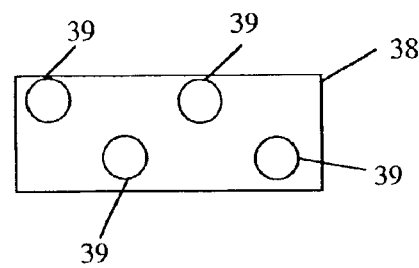
FIG. 13 shows a top view the surface of the GaP layer without any P atoms.

Then, an InAs substrate 35 is provided. The InAs substrate 35 undergoes the same treatment as the InAs substrate 15 previously discussed. As a result, the surface of the InAs substrate 35 contains In atoms, As atoms, and is essentially oxide free. An epitaxial GaP layer 37 is deposited on the InAs substrate 15, as shown in FIG. 12, using molecular beam epitaxy. The epitaxial GaP layer 37 is roughly 4 Å–6 Å thick, however, if spacing is limited a thinner layer can be applied, or if there is an abundance of space, a thicker layer can be applied. Since the GaP layer 37 is deposited using molecular beam epitaxy, the surface 38 is already essentially oxide free. Furthermore, the use of molecular beam epitaxy allows strict control over the atoms found in the different layers of the substrate. As such, the surface layer 38 in the epitaxial GaP layer 37 preferably comprises only Ga atoms 39 as shown in FIG. 13. Then, surface 27 of the InP substrate 25 can be brought together with the surface layer 38 of the GaP layer 37 where the P atoms 31 on the surface 27 of the InP substrate 25 will bond to the Ga atoms 39 on the surface layer 38 of the GaP layer 37.

Although, this procedure will work for any two substrates, we prefer to use the substrates aforementioned in the disclosure.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A method of improving a surface of a first substrate and a surface of a second substrate for bonding, said method comprising:
   (a) holding the first, comprising a first plurality of elements, and the second substrate comprising a second plurality of elements, at a first temperature for a period of time in a depressurized system, thereby removing essentially all oxide from the surface of the first substrate and the surface of the second substrate, and thereby causing atoms of a first element in the first plurality of elements to evaporate from the surface of the first substrate and atoms of a second element in the second plurality of elements to evaporate from the surface of the second substrate; and
   (b) flowing an over-pressure of a first gas comprised of the first element over the surface of the first substrate, thereby replacing atoms of the first element that have evaporated and flowing an over-pressure of a second gas comprised of the second element over the surface of the second substrate, thereby replacing atoms of the second element that have evaporated.

2. The method of claim 1, further comprising:
   (c) allowing the first and second substrate to cool; and
   (d) terminating the flow of the over-pressure of the first gas and terminating the flow of the over-pressure of the second gas.

3. The method of claim 2, wherein terminating the flow of the first gas occurs when the first substrate has cooled to a second temperature so as to allow the atoms of the first element to continue evaporating from the surface of the first substrate.

4. The method of claim 2, wherein terminating the flow of the first gas occurs when the first substrate has cooled to a second temperature so as to allow the atoms of the first element to remain on the surface of the first substrate.

5. The method of claim 2, wherein terminating the flow of the second gas occurs when the second substrate has cooled to a second temperature so as to allow the atoms of the second element to continue evaporating from the surface of the second substrate.

6. The method of claim 2, wherein terminating the flow of the second gas occurs when the second substrate has cooled to a second temperature so as to allow the atoms of the second element to remain on the surface of the second substrate.

7. The method of claim 1, wherein the first and second plurality of elements comprise at least one group III element and at least one group V element.

8. The method of claim 1, wherein the depressurized system is at a pressure no greater than $3 \times 10^{-6}$ pa.

9. The method of claim 1, wherein the over-pressure of the first gas and the second gas are at a pressure no greater than $1 \times 10^{-2}$ pa.

10. The method of claim 1, wherein holding the first substrate and second substrate at a first temperature for a period of time comprises holding the first substrate and second substrate at a temperature in the range of 500° C. to 535° C. for approximately 10 minutes–20 minutes.

11. A method for improving a surface of a first substrate for bonding, the method comprising:
   (a) exposing the first substrate to a first pressure, wherein the first substrate comprises a plurality of elements having a crystal structure;
   (b) holding the first substrate, while exposed to the first pressure, at a first temperature for a period of time, thereby removing essentially all oxide from the surface of the first substrate;
   (c) flowing an over-pressure of gas past the surface of first substrate during holding, the over-pressure of gas comprised of an element found in the plurality of elements, thereby maintaining the crystal structure of the first substrate;
   (d) allowing the first substrate to cool to a second temperature; and
   (e) terminating the flow of the over-pressure of gas past the surface of the first substrate when the first substrate has cooled to the second temperature.

12. The method of claim 11, wherein holding causes atoms of the element to evaporate from the surface of the substrate.

13. The method of claim 12, wherein flowing replaces atoms of the element which have evaporated from the surface of the substrate.

14. The method of claim 13, wherein terminating determines whether atoms of the element continue evaporating from the surface of the substrate or remain on the surface of the substrate.

15. The method of claim 14, wherein the plurality of elements comprises at least one group III element and at least one group V element.

16. The method of claim 15, wherein the first substrate comprises In and at least one member selected from the group consisting of P and As.

17. The method of claim 16, wherein the over-pressure of gas comprises $P_2$ when the first substrate comprises InP, and wherein the over-pressure of gas comprises $As_2$ when the first substrate comprises InAs.

18. The method of claim 17, wherein the element is P when the gas comprises $P_2$ and the first substrate is InP, and wherein the element is As when the gas comprises $As_2$ and the first substrate is InAs.

19. The method of claim 18, wherein the second temperature is such that atoms of the element continue evaporating from the surface of the first substrate after terminating the flow of the over-pressure of gas.

20. The method of claim 18, wherein the second temperature is such that atoms of the element remain on the surface of the first substrate after terminating the flow of the over-pressure of gas.

21. The method of claim 19, wherein the second temperature is about 400° C.

22. The method of claim 20, wherein the second temperature is about 180° C. when the element is P and wherein the second temperature is about 280° C. when the element is As.

23. The method of claim 11, wherein the first pressure is no greater than $3 \times 10^{-6}$ pa.

24. The method of claim 11, wherein the over-pressure of gas is at a pressure no greater than $1 \times 10^{-2}$ pa.

25. The method of claim 11, wherein holding the first substrate at a first temperature for a period of time comprises holding the first substrate at a temperature in the range of 500° C.–535° C. for approximately 10 minutes–20 minutes.

26. A method of improving a surface of a first substrate for bonding, said method comprising:
   (a) exposing the first substrate to a first pressure in a depressurized system, wherein the first substrate comprises a plurality of elements having a crystal structure;
   (b) holding the first substrate, while exposed to the first pressure, at a first temperature for a period of time, thereby removing essentially all oxide from the surface of the first substrate; and (c) flowing an over-pressure of gas past the surface of the first substrate during holding, the over-pressure of gas comprised of an element found in the plurality of elements, thereby maintaining the crystal structure of the first substrate.

27. The method of claim 26, further comprising:

(d) allowing the first substrate to cool to a second temperature after holding the substrate at a first temperature for a period of time; and (e) terminating the over-pressure of gas when the first substrate has cooled to the second temperature.

28. The method of claim 27, wherein holding causes atoms of the element to evaporate from the surface of the substrate.

29. The method of claim 28, wherein flowing replaces the atoms of the element which have evaporated from the surface of the substrate.

30. The method of claim 29, wherein terminating determines whether atoms of the element continue evaporating from the surface of the substrate or remain on the surface of the substrate.

31. The method of claim 30, wherein the second temperature is such that atoms of the element continue evaporating from the surface of the first substrate after terminating the over-pressure of gas.

32. The method of claim 30, wherein the second temperature is such that atoms of the element remain on the surface of the first substrate after terminating the over-pressure of gas.

33. The method of claim 31, wherein the first substrate comprises InP, the over-pressure of gas comprises $P_2$, the element is P, and the second temperature is about 400° C.

34. The method of claim 31, wherein the first substrate comprises InAs, the over-pressure of gas comprises $As_2$, the element is As, and the second temperature is about 400° C.

35. The method of claim 32, wherein the first substrate comprises InP, the gas over-pressure comprises $P_2$, the element is P, and the second temperature is about 180° C.

36. The method of claim 32, wherein the first substrate comprises InAs, the gas over-pressure comprises $As_2$, the element is As, and the second temperature is about 280° C.

37. The method of claim 26, wherein the first pressure is no greater than $3 \times 10^{-6}$ pa.

38. The method of claim 26, wherein the over-pressure of gas is at a pressure no greater than $1 \times 10^{-2}$ pa.

39. The method of claim 11 for improving the surface of the first substrate and for also improving a surface of an additional substrate, the method comprising:

(a) exposing said additional substrate to said first pressure, said additional substrate comprising another plurality of elements having a crystal structure (b) holding the additional substrate, while exposed to the first pressure, at the first temperature for the period of time, thereby removing essentially all oxide from the surface of the additional substrate;

(c) flowing an over-pressure of another gas past the surface of additional substrate while holding the additional substrate, the over-pressure of the another gas comprised of an element found in the another plurality of elements, thereby maintaining the crystal structure of the additional substrate;

(d) allowing the additional substrate to cool to said second temperature; and (e) terminating the flow of the over-pressure of the another gas past the surface of the additional substrate when the additional substrate has cooled to the second temperature.

* * * * *